(12) United States Patent
Cui et al.

(10) Patent No.: US 12,525,433 B2
(45) Date of Patent: Jan. 13, 2026

(54) METHOD AND APPARATUS TO REDUCE FEATURE CHARGING IN PLASMA PROCESSING CHAMBER

(71) Applicant: Applied Materials, Inc., Santa Clara, CA (US)

(72) Inventors: Linying Cui, Cupertino, CA (US); James Rogers, Los Gatos, CA (US); Rajinder Dhindsa, Pleasanton, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 687 days.

(21) Appl. No.: 17/352,176

(22) Filed: Jun. 18, 2021

(65) Prior Publication Data

US 2022/0399183 A1 Dec. 15, 2022

Related U.S. Application Data

(60) Provisional application No. 63/208,903, filed on Jun. 9, 2021.

(51) Int. Cl.
*H01L 21/306* (2006.01)
*H01J 37/305* (2006.01)
(Continued)

(52) U.S. Cl.
CPC .... *H01J 37/32146* (2013.01); *H01J 37/3053* (2013.01); *H01J 37/32128* (2013.01);
(Continued)

(58) Field of Classification Search
CPC ........... H01J 37/32128; H01J 37/32137; H01J 37/32146; H01J 37/32174; H01J 37/32091; H01L 21/3065
See application file for complete search history.

(56) References Cited

U.S. PATENT DOCUMENTS 4,070,589 A 1/1978 Martinkovic
4,340,462 A 7/1982 Koch
(Continued)

FOREIGN PATENT DOCUMENTS

CN 101707186 B 2/2012
CN 106206234 A 12/2016
(Continued)

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.
(Continued)

*Primary Examiner* — Luz L Alejandro Mulero
(74) *Attorney, Agent, or Firm* — Patterson + Sheridan, LLP

(57) ABSTRACT

Embodiments provided herein include an apparatus and methods for the plasma processing of a substrate in a processing chamber. In some embodiments, aspects of the apparatus and methods are directed to reducing defectivity in features formed on the surface of the substrate, improving plasma etch rate, and increasing selectivity of etching material to mask and/or etching material to stop layer. In some embodiments, the apparatus and methods enable processes that can be used to prevent or reduce the effect of trapped charges, disposed within features formed on a substrate, on the etch rate and defect formation. In some embodiments, the plasma processing methods include the synchronization of the delivery of pulsed-voltage (PV) waveforms, and alternately the delivery of a PV waveform and a radio frequency (RF) waveform, so as to allow for the independent control of generation of electrons that are provided, during one or more stages of a PV waveform cycle, to neutralize the
(Continued)

trapped charges formed in the features formed on the substrate.

6 Claims, 9 Drawing Sheets

(51) Int. Cl.
    *H01J 37/32*     (2006.01)
    *H01L 21/3065*     (2006.01)
    *H01L 21/683*     (2006.01)

(52) U.S. Cl.
    CPC .. *H01J 37/32137* (2013.01); *H01J 37/32174* (2013.01); *H01J 37/3255* (2013.01); *H01J 37/32715* (2013.01); *H01L 21/3065* (2013.01); *H01L 21/6833* (2013.01); *H01J 2237/2007* (2013.01); *H01J 2237/334* (2013.01)

(56) References Cited

U.S. PATENT DOCUMENTS

| | | | |
|---|---|---|---|
| 4,464,223 A | 8/1984 | Gorin | |
| 4,504,895 A | 3/1985 | Steigerwald | |
| 4,585,516 A | 4/1986 | Corn et al. | |
| 4,683,529 A | 7/1987 | Bucher, II | |
| 4,931,135 A | 6/1990 | Horiuchi et al. | |
| 4,992,919 A | 2/1991 | Lee et al. | |
| 5,099,697 A | 3/1992 | Agar | |
| 5,140,510 A | 8/1992 | Myers | |
| 5,449,410 A | 9/1995 | Chang et al. | |
| 5,451,846 A | 9/1995 | Peterson et al. | |
| 5,464,499 A | 11/1995 | Moslehi et al. | |
| 5,554,959 A | 9/1996 | Tang | |
| 5,565,036 A | 10/1996 | Westendorp et al. | |
| 5,595,627 A | 1/1997 | Inazawa et al. | |
| 5,597,438 A | 1/1997 | Grewal et al. | |
| 5,610,452 A | 3/1997 | Shimer et al. | |
| 5,614,026 A * | 3/1997 | Williams | H01L 21/67017 |
| | | | 427/575 |
| 5,698,062 A | 12/1997 | Sakamoto et al. | |
| 5,716,534 A | 2/1998 | Tsuchiya et al. | |
| 5,770,023 A | 6/1998 | Sellers | |
| 5,796,598 A | 8/1998 | Nowak et al. | |
| 5,810,982 A | 9/1998 | Sellers | |
| 5,830,330 A | 11/1998 | Lantsman | |
| 5,882,424 A | 3/1999 | Taylor et al. | |
| 5,928,963 A | 7/1999 | Koshiishi | |
| 5,933,314 A | 8/1999 | Lambson et al. | |
| 5,935,373 A | 8/1999 | Koshimizu | |
| 5,948,704 A | 9/1999 | Benjamin et al. | |
| 5,997,687 A | 12/1999 | Koshimizu | |
| 6,043,607 A | 3/2000 | Roderick | |
| 6,051,114 A | 4/2000 | Yao et al. | |
| 6,055,150 A | 4/2000 | Clinton et al. | |
| 6,074,518 A | 6/2000 | Imafuku et al. | |
| 6,089,181 A | 7/2000 | Suemasa et al. | |
| 6,095,084 A * | 8/2000 | Shamouilian | H01J 37/32559 |
| | | | 156/345.47 |
| 6,099,697 A | 8/2000 | Hausmann | |
| 6,110,287 A | 8/2000 | Arai et al. | |
| 6,117,279 A | 9/2000 | Smolanoff et al. | |
| 6,125,025 A | 9/2000 | Howald et al. | |
| 6,133,557 A | 10/2000 | Kawanabe et al. | |
| 6,136,387 A | 10/2000 | Koizumi | |
| 6,187,685 B1 | 2/2001 | Hopkins et al. | |
| 6,197,151 B1 | 3/2001 | Kaji et al. | |
| 6,198,616 B1 | 3/2001 | Dahimene et al. | |
| 6,201,208 B1 | 3/2001 | Wendt et al. | |
| 6,214,162 B1 | 4/2001 | Koshimizu | |
| 6,232,236 B1 | 5/2001 | Shan et al. | |
| 6,252,354 B1 | 6/2001 | Collins et al. | |
| 6,253,704 B1 | 7/2001 | Savas | |
| 6,277,506 B1 | 8/2001 | Okamoto | |
| 6,309,978 B1 | 10/2001 | Donohoe et al. | |
| 6,313,583 B1 | 11/2001 | Arita et al. | |
| 6,355,992 B1 | 3/2002 | Via | |
| 6,358,573 B1 | 3/2002 | Raoux et al. | |
| 6,392,187 B1 | 5/2002 | Johnson | |
| 6,395,641 B2 | 5/2002 | Savas | |
| 6,413,358 B2 | 7/2002 | Donohoe | |
| 6,423,192 B1 | 7/2002 | Wada et al. | |
| 6,433,297 B1 | 8/2002 | Kojima et al. | |
| 6,435,131 B1 | 8/2002 | Koizumi | |
| 6,451,389 B1 | 9/2002 | Amann et al. | |
| 6,456,010 B2 | 9/2002 | Yamakoshi et al. | |
| 6,483,731 B1 | 11/2002 | Isurin et al. | |
| 6,535,785 B2 | 3/2003 | Johnson et al. | |
| 6,621,674 B1 | 9/2003 | Zahringer et al. | |
| 6,664,739 B1 | 12/2003 | Kishinevsky et al. | |
| 6,733,624 B2 | 5/2004 | Koshiishi et al. | |
| 6,740,842 B2 | 5/2004 | Johnson et al. | |
| 6,741,446 B2 | 5/2004 | Ennis | |
| 6,777,037 B2 | 8/2004 | Sumiya et al. | |
| 6,808,607 B2 | 10/2004 | Christie | |
| 6,818,103 B1 | 11/2004 | Scholl et al. | |
| 6,818,257 B2 | 11/2004 | Amann et al. | |
| 6,830,595 B2 | 12/2004 | Reynolds, III | |
| 6,830,650 B2 | 12/2004 | Roche et al. | |
| 6,849,154 B2 | 2/2005 | Nagahata et al. | |
| 6,861,373 B2 | 3/2005 | Aoki et al. | |
| 6,863,020 B2 | 3/2005 | Mitrovic et al. | |
| 6,896,775 B2 | 5/2005 | Chistyakov | |
| 6,902,646 B2 | 6/2005 | Mahoney et al. | |
| 6,917,204 B2 | 7/2005 | Mitrovic et al. | |
| 6,947,300 B2 | 9/2005 | Pai et al. | |
| 6,962,664 B2 | 11/2005 | Mitrovic | |
| 6,970,042 B2 | 11/2005 | Glueck | |
| 7,016,620 B2 | 3/2006 | Maess et al. | |
| 7,046,088 B2 | 5/2006 | Ziegler | |
| 7,104,217 B2 | 9/2006 | Himori et al. | |
| 7,115,185 B1 | 10/2006 | Gonzalez et al. | |
| 7,126,808 B2 | 10/2006 | Koo et al. | |
| 7,147,759 B2 | 12/2006 | Chistyakov | |
| 7,151,242 B2 | 12/2006 | Schuler | |
| 7,166,233 B2 | 1/2007 | Johnson et al. | |
| 7,183,177 B2 | 2/2007 | Al-Bayati et al. | |
| 7,206,189 B2 | 4/2007 | Reynolds, III | |
| 7,218,503 B2 | 5/2007 | Howald | |
| 7,218,872 B2 | 5/2007 | Shimomura | |
| 7,226,868 B2 | 6/2007 | Mosden et al. | |
| 7,265,963 B2 | 9/2007 | Hirose | |
| 7,274,266 B2 | 9/2007 | Kirchmeier | |
| 7,305,311 B2 | 12/2007 | van Zyl | |
| 7,312,974 B2 | 12/2007 | Kuchimachi | |
| 7,408,329 B2 | 8/2008 | Wiedemuth et al. | |
| 7,415,940 B2 | 8/2008 | Koshimizu et al. | |
| 7,440,301 B2 | 10/2008 | Kirchmeier et al. | |
| 7,452,443 B2 | 11/2008 | Gluck et al. | |
| 7,479,712 B2 | 1/2009 | Richert | |
| 7,509,105 B2 | 3/2009 | Ziegler | |
| 7,512,387 B2 | 3/2009 | Glueck | |
| 7,535,688 B2 | 5/2009 | Yokouchi et al. | |
| 7,586,099 B2 | 9/2009 | Eyhorn et al. | |
| 7,586,210 B2 | 9/2009 | Wiedemuth et al. | |
| 7,588,667 B2 | 9/2009 | Cerio, Jr. | |
| 7,601,246 B2 | 10/2009 | Kim et al. | |
| 7,609,740 B2 | 10/2009 | Glueck | |
| 7,618,686 B2 | 11/2009 | Colpo et al. | |
| 7,633,319 B2 | 12/2009 | Arai | |
| 7,645,341 B2 | 1/2010 | Kennedy et al. | |
| 7,651,586 B2 | 1/2010 | Moriya et al. | |
| 7,652,901 B2 | 1/2010 | Kirchmeier et al. | |
| 7,692,936 B2 | 4/2010 | Richter | |
| 7,700,474 B2 | 4/2010 | Cerio, Jr. | |
| 7,705,676 B2 | 4/2010 | Kirchmeier et al. | |
| 7,706,907 B2 | 4/2010 | Hiroki | |
| 7,718,538 B2 | 5/2010 | Kim et al. | |
| 7,740,704 B2 | 6/2010 | Strang | |
| 7,758,764 B2 | 7/2010 | Dhindsa et al. | |
| 7,761,247 B2 | 7/2010 | van Zyl | |
| 7,782,100 B2 | 8/2010 | Steuber et al. | |
| 7,791,912 B2 | 9/2010 | Walde | |
| 7,795,817 B2 | 9/2010 | Nitschke | |

(56) References Cited

U.S. PATENT DOCUMENTS

| | | |
|---|---|---|
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |

(56) References Cited

U.S. PATENT DOCUMENTS

| | | |
|---|---|---|
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapinski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |

(56) References Cited

U.S. PATENT DOCUMENTS

| | | |
|---|---|---|
| 2003/0137791 A1 | 7/2003 | Amnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0123800 A1* | 7/2004 | Schlottmann ......... C23C 16/455 118/715 |
| 2004/0223284 A1 | 11/2004 | Wami et al. |
| 2005/0014382 A1* | 1/2005 | Lee ................... H01J 37/32082 438/706 |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Surin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0141941 A1* | 6/2008 | Augustino ........ H01J 37/32541 438/758 |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0000946 A1 | 1/2009 | Singh et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0031216 A1* | 2/2011 | Liao ................... H01L 21/31116 216/67 |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0052689 A1 | 3/2012 | Tokashiki |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0099722 A1* | 4/2017 | Kawasaki ................ H05H 1/46 |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |

(56) References Cited

U.S. PATENT DOCUMENTS

| | | |
|---|---|---|
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157043 A1* | 5/2019 | Shaw ............... H01J 37/32477 |
| 2019/0157044 A1 | 5/2019 | Ziemba et al. |
| 2019/0172685 A1 | 6/2019 | Van Zyl et al. |
| 2019/0172688 A1 | 6/2019 | Jeda |
| 2019/0180982 A1 | 6/2019 | Brouk et al. |
| 2019/0198333 A1 | 6/2019 | Tokashiki |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058469 A1 | 2/2020 | Ranjan et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1* | 12/2020 | Koshimizu ......... H01L 21/3065 |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0288582 A1 | 9/2021 | Ziemba et al. |

FOREIGN PATENT DOCUMENTS

| | | |
|---|---|---|
| CN | 104752134 B | 2/2017 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 2009246091 A | 10/2009 |
| JP | 4418424 B2 | 2/2010 |
| JP | 2011035266 A | 2/2011 |
| JP | 2012054534 A | 3/2012 |
| JP | 2012-079886 A | 4/2012 |
| JP | 5018244 B2 | 9/2012 |
| JP | 2014112644 A | 6/2014 |
| JP | 2017212447 A | 11/2017 |
| JP | 2018026331 A | 2/2018 |
| JP | 6741461 B2 | 8/2020 |
| KR | 100757347 B1 | 9/2007 |
| KR | 20120022251 A | 3/2012 |
| KR | 20160042429 A | 4/2016 |
| KR | 20180011711 A | 2/2018 |
| KR | 20200100642 A | 8/2020 |
| TW | 201923820 A | 6/2019 |
| TW | 201933422 A | 8/2019 |
| TW | 202040682 A | 11/2020 |
| WO | 2000017920 A1 | 3/2000 |
| WO | 2002059954 A1 | 8/2002 |
| WO | 2008050619 A1 | 5/2008 |

(56) References Cited

FOREIGN PATENT DOCUMENTS

| | | | |
|---|---|---|---|
| WO | 2014124857 | A3 | 5/2015 |
| WO | 2015134398 | A1 | 9/2015 |
| WO | 2015198854 | A1 | 12/2015 |
| WO | 2016002547 | A1 | 1/2016 |
| WO | 2015073921 | A8 | 5/2016 |
| WO | 2016131061 | A1 | 8/2016 |
| WO | 2017172536 | A1 | 10/2017 |
| WO | 2018048925 | A1 | 3/2018 |
| WO | 2018170010 | A1 | 9/2018 |
| WO | 2019036587 | A1 | 2/2019 |
| WO | 2019040949 | A1 | 2/2019 |
| WO | 2019099870 | A1 | 5/2019 |
| WO | 2019185423 | A1 | 10/2019 |
| WO | 2019225184 | A1 | 11/2019 |
| WO | 2019239872 | A1 | 12/2019 |
| WO | 2019245729 | A1 | 12/2019 |
| WO | 2020004048 | A1 | 1/2020 |
| WO | 2020017328 | A1 | 1/2020 |
| WO | 2020051064 | A1 | 3/2020 |
| WO | 2020121819 | A1 | 6/2020 |
| WO | 2021003319 | A1 | 1/2021 |
| WO | 2021062223 | A1 | 4/2021 |
| WO | 2021097459 | A1 | 5/2021 |
| WO | 2021134000 | A1 | 7/2021 |

OTHER PUBLICATIONS

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"In Situ Testing of EHT Integrators on a Tokamak," 2015, 1 page.
Eagle Harbor Technologies webpage—High Gain and Frequency Ultra-Stable Integrators for Long Pulse and/or High Current Applications, 2018, 1 page.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—"Long-Pulse Integrator Testing with DIII-D Magnetic Diagnostics," 2016, 1 page.
Sunstone Circuits—"Eagle Harbor Tech Case Study," date unknown, 4 pages.
Electrical 4 U webpage—"Clamping Circuit," Aug. 29, 2018, 1 page.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Semiconductor Components Industries, LLC (SCILLC)—"Switch-Mode Power Supply" Reference Manual, SMPSRM/D, Rev. 4, Apr. 2014, ON Semiconductor, 73 pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Richard Barnett et al. A New Plasma Source for Next Generation MEMS Deep Si Etching: Minimal Tilt, Improved Profile Uniformity and Higher Etch Rates, SPP Process Technology Systems. 2010.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
Yiting Zhang et al. "Investigation of feature orientation and consequences of ion tilting during plasma etching with a three-dimensional feature profile simulator", Nov. 22, 2016.
S.B. Wang et al. "Ion Bombardment Energy and SiO 2/Si Fluorocarbon Plasma Etch Selectivity", Journal of Vacuum Science & Technology A 19, 2425 (2001).
Zhen-hua Bi et al., A brief review of dual-frequency capacitively coupled discharges, Current Applied Physics, vol. 11, Issue 5, Supplement, 2011, pp. S2-S8.
Chang, Bingdong, "Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With a DC Bias" A Dissertation in Physics. Dec. 1994.
Michael A. Lieberman, "Principles of Plasma Discharges and Material Processing", A Wiley Interscience Publication. 1994.
International Search Report/ Written Opinion issued to PCT/US2022/029700 on Sep. 14, 2022.
Japanese Office Action for Applicaiton No. 2023-569818 dated Oct. 1, 2024.
Korean Office action dated Feb. 24, 2025 for Application No. 10-2024-7000529.
Taiwan Office Action dated Jan. 21, 2025 for Application No. 111121221.
Taiwan Office Action dated Apr. 30, 2025 for Application No. 111121221.
Japanese Office Action for Applicaiton No. 2023-569818 dated Jul. 8, 2025.

* cited by examiner

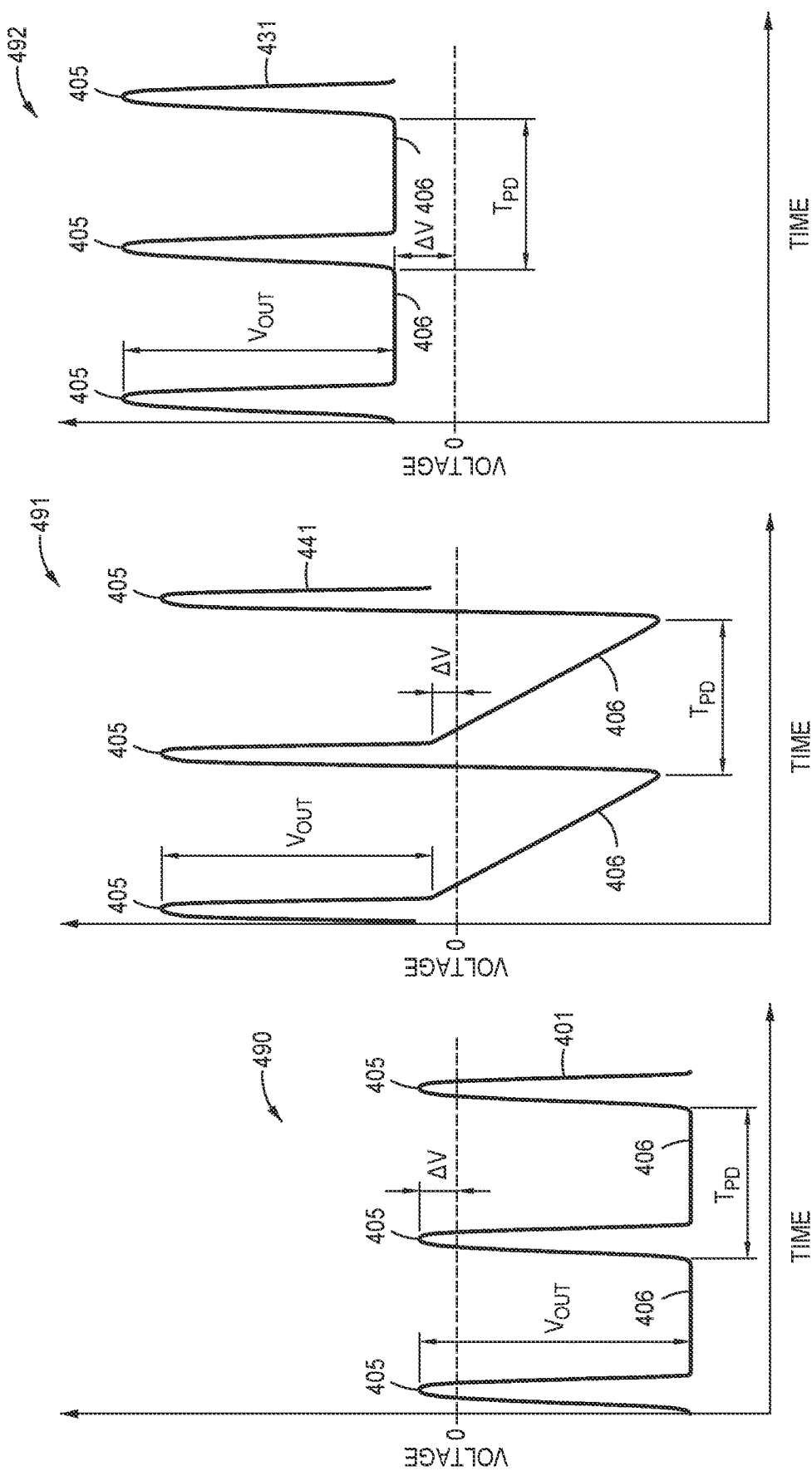

METHOD AND APPARATUS TO REDUCE FEATURE CHARGING IN PLASMA PROCESSING CHAMBER

CROSS-REFERENCE TO RELATED APPLICATIONS

This application claims the benefit of U.S. Provisional Patent Application Ser. No. 63/208,903, filed Jun. 9, 2021, which is herein incorporated by reference.

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With semiconductor device technology nodes advancing towards 2 nanometers (nm) and below, the fabrication of smaller high aspect ratio features requires atomic level precision during the various plasma fabrication processes. For etching processes, where the plasma generated ions play a major role in the success of the etching process, ion energy and directionality control are key elements to desirably forming etched high aspect ratio features. It believed that feature distortion type of defects in high aspect ratio features, such as twisting, tapering, and microtrenching are all related to charges being trapped within the formed feature. FIG. 1 is a schematic view of a feature formed in a portion of a surface of a substrate that includes trapped charge in the walls of the formed feature. It is believed that, due to the different angular distribution of ions versus electrons in typical ion assisted etching applications, positive charges tend to accumulate deep in the walls of the feature. As illustrated in FIG. 1, the accumulation of positive charges in the features create a local electric field which decelerates incoming ions during plasma processing, and thus will reduce the etch rate as the high aspect ratio feature is formed and will tend to increase the likelihood of feature distortion in the formed high aspect ratio feature.

Accordingly, there is a need for a system, device(s) and methods that solve the problems described above.

SUMMARY

Embodiments provided herein generally include apparatus, e.g., plasma processing systems, and methods for the plasma processing of a substrate in a processing chamber. In some embodiments, aspects of the apparatus and methods are directed to reducing defectivity on the surface of the substrate and improve etch rate.

Embodiments of the disclosure may provide a plasma processing system comprising a substrate support assembly, a first waveform generator, a first electrode, a second waveform generator, and a controller. The substrate support assembly comprises a substrate supporting surface, a bias electrode, and a first dielectric layer disposed between the bias electrode and the substrate supporting surface. The first waveform generator is coupled to the bias electrode, wherein the first waveform generator is configured to generate a first plurality of pulsed voltage waveforms that are established at the bias electrode, and each of the pulsed voltage waveforms of the first plurality of pulsed voltage waveforms comprise a first stage and a second stage that has a lower voltage level than a voltage level in the first stage. The first electrode disposed over the substrate supporting surface. The second waveform generator is coupled to the first electrode, wherein the second waveform generator is configured to generate a second plurality of pulsed voltage waveforms that are established at the first electrode, and each of the pulsed voltage waveforms of the second plurality of pulsed voltage waveforms comprise a first stage and a second stage that has a higher voltage level than a voltage level in the first stage. The controller comprises a memory that comprises computer implemented instructions, which, when executed by a processor, is configured to synchronize the generation of the first plurality of pulsed voltage waveforms and the second plurality of pulsed voltage waveforms, such that the first stage of the pulsed waveforms in the first plurality of pulsed voltage waveforms and the first stage of the pulsed waveforms in the second plurality of pulsed voltage waveforms at least partially overlap in time, and the second stage of the pulsed waveforms in the first plurality of pulsed voltage waveforms and the second stage of the pulsed waveforms in the second plurality of pulsed voltage waveforms at least partially overlap in time.

Embodiments of the disclosure may further provide a plasma processing system comprising a substrate support assembly, a first waveform generator, a first electrode, a second waveform generator, and a controller. The substrate support assembly comprises a substrate supporting surface, a bias electrode, and a first dielectric layer disposed between the bias electrode and the substrate supporting surface. The first waveform generator is coupled to the bias electrode, wherein the first waveform generator is configured to generate a first plurality of pulsed voltage waveforms that are established at the bias electrode, and each of the pulsed voltage waveforms of the first plurality of pulsed voltage waveforms comprise a first stage and a second stage. The first electrode disposed over the substrate supporting surface. The second waveform generator is coupled to the first electrode, wherein the second waveform generator is configured to generate a second plurality of pulsed voltage waveforms that are established at the first electrode, and each of the pulsed voltage waveforms of the second plurality of pulsed voltage waveforms comprise a first stage and a second stage. The controller comprises a memory that comprises computer implemented instructions, which, when executed by a processor, is configured to synchronize the generation of the first plurality of pulsed voltage waveforms and the second plurality of pulsed voltage waveforms, such that each of the pulsed waveforms in the first plurality of pulsed voltage waveforms and each of the pulsed waveforms in the second plurality of pulsed voltage waveforms are inversely configured.

Embodiments of the disclosure may further provide a processing method, comprising establishing, by use of a first waveform generator, a first pulse voltage waveform at a bias electrode disposed in a substrate support assembly, and establishing, by use of a second waveform generator, a second pulse voltage waveform at a surface of a first electrode disposed over the substrate support assembly. The first pulse voltage waveform comprises a first stage, and a second stage that has a lower voltage level than a voltage level in the first stage. The second pulse voltage waveform comprises a first stage, and a second stage that has a higher voltage level than a voltage level in the first stage. During the processing method the first pulse voltage waveform and the second pulse voltage waveform are synchronized, so that the first stage of the first pulse voltage waveform and the first stage of the second pulse voltage waveform at least partially overlap in time, and the second stage of the first pulse voltage waveform and the second stage of the second pulse voltage waveform at least partially overlap in time.

Embodiments of the disclosure may further provide a processing method that includes establishing, by use of a first waveform generator, a first pulse voltage waveform at a bias electrode disposed in a substrate support assembly, and establishing, by use of a RF waveform generator, an RF waveform at a first electrode disposed over the substrate support assembly. The first pulse voltage waveform may include a first stage, and a second stage that has a lower voltage level than a voltage level in the first stage. The substrate support assembly comprising a substrate supporting surface, the bias electrode, and a first dielectric layer disposed between the bias electrode and the substrate supporting surface. The RF waveform can include a sinusoidal waveform, and the first pulse voltage waveform and the RF waveform are synchronized, so that a trough of the RF waveform is formed during a period of time when the first stage of the first pulse voltage waveform is established at the bias electrode, and a peak of the RF waveform is formed during a period of time when the second stage of the first pulse voltage waveform is established at the bias electrode.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIGS. 4A-4C illustrate examples of pulsed voltage (PV) waveforms that can be established at an electrode using one or more of the embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
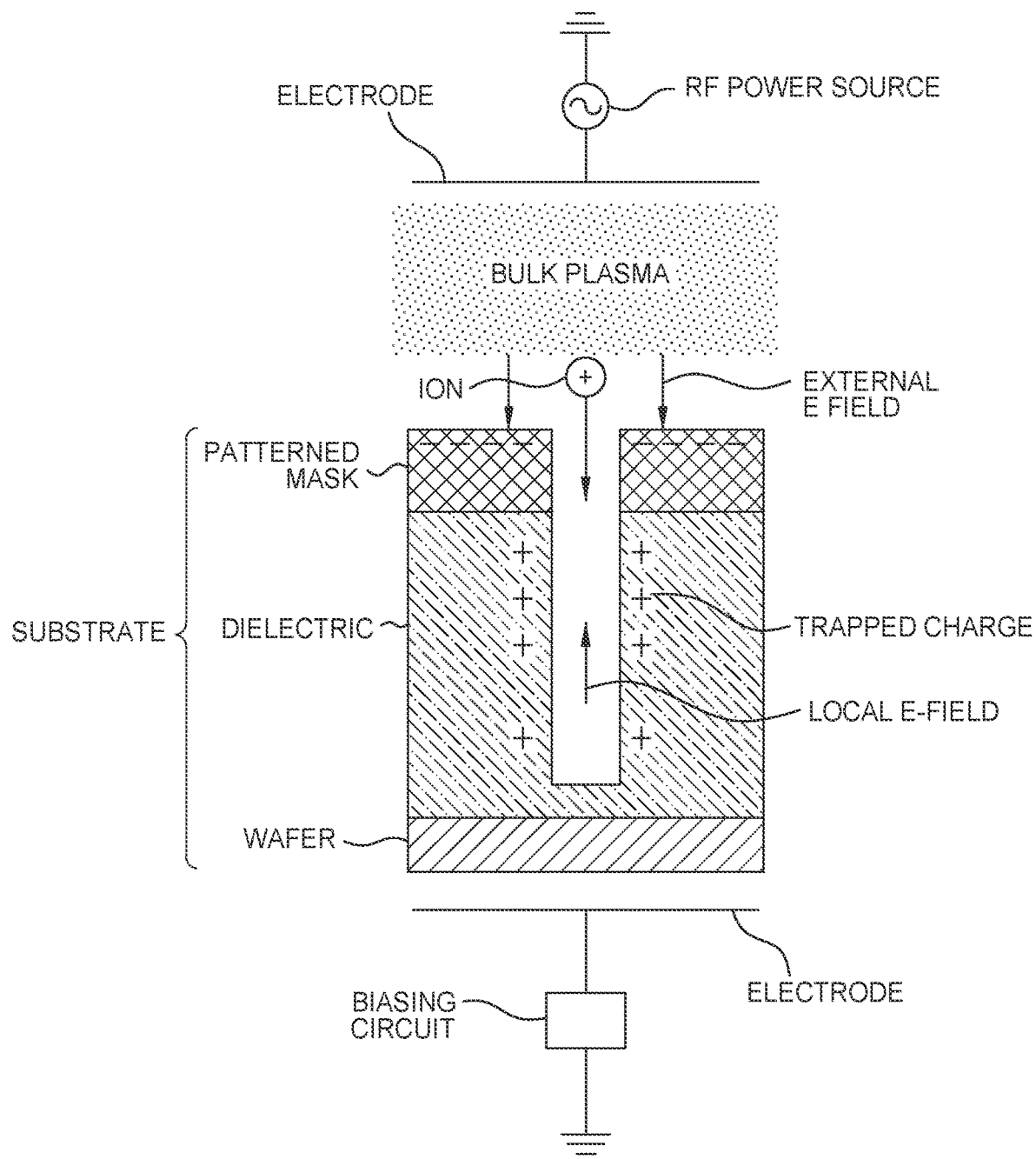
FIG. 1 is a schematic cross-sectional view of a portion of a substrate during a conventional plasma process.

Embodiments provided herein include an apparatus and methods for the plasma processing of a substrate in a processing chamber. In some embodiments, aspects of the apparatus and methods are directed to reducing defectivity in features formed on the surface of the substrate and improve plasma etch rate. In some embodiments, the apparatus and methods disclosed herein are configured to improve etch selectivity of different materials on the substrate. In some embodiments, the apparatus and methods enable processes that can be used to prevent or reduce the effect of trapped charges, disposed within features formed on a substrate, on the etch rate and defect formation. In some embodiments, the plasma processing methods include the synchronization of the delivery of pulsed-voltage (PV) waveforms, and alternately the delivery of a PV waveform and a radio frequency (RF) waveform, so as to allow for the generation of electrons that are provided, during one or more stages of a PV waveform cycle, to neutralize the trapped charges formed in the features formed on the substrate.

As is discussed in further detail below, one or more of the processes disclosed herein include the generation secondary electrons, which are emitted from an electrode disposed over or adjacent to a surface of a substrate, while a PV waveform is established at a bias electrode positioned adjacent to a substrate during a plasma processing. Embodiments of the disclosure may also include an apparatus and method for providing a pulsed-voltage (PV) waveform to one or more electrodes within the processing chamber while biasing and clamping a substrate during the plasma process. In some embodiments, the PV waveform(s) are established by one or more PV waveform generators that are electrically coupled to one or more electrodes disposed within the substrate support assembly. In some embodiments, at least one electrode of the one or more electrodes includes a chucking electrode that is coupled to one of the one or more PV waveform generators.

In some embodiments, a radio frequency (RF) generated RF waveform is provided from an RF generator to one or more electrodes within the process chamber to establish and maintain a plasma within the process chamber, while PV waveform(s) are used to at least: 1) generate secondary electrons to neutralize the trapped charges formed in the features formed on a substrate; and 2) control the sheath voltage across the surface of the substrate during processing. The ability to control the sheath voltage, such that the sheath voltage is nearly constant throughout the plasma process, also allows for the formation of a desirable ion energy distribution function (IEDF) at the surface of the substrate during the one or more plasma processing operations, and thus will improve the plasma processing results by providing a corresponding single (narrow) peak containing IEDF for the ions accelerated towards the surface of the substrate. In some embodiments, as discussed further below, it is desirable to deliver PV waveforms, serially or in bursts, that have differing pulse voltage levels (i.e., peak-to-peak voltage levels ($V_{pp}$)) so as to form an IEDF that has two or more discrete IED peaks. In some embodiments, the PV wave form(s) can be configured to cause a nearly constant sheath voltage to be formed for a sizable portion of the PV waveform's pulse period, referred to herein as the "ion-current stage."

Beneficially, the apparatus and methods disclosed herein may be used alone or in combination to provide individual tuning knobs for controlling ion energy, electron energy, ion and electron angular distribution functions, and ion and electron flux that interacts with the surface of the substrate. Thus, the ability to separately control ion energy, electron energy, ion and electron angular distribution functions, electron flux and ion flux at the processing surface provides desirable tuning parameters which may be used to optimize the etching profiles needed for the tight tolerances for next generation of electronic devices, the higher etch selectivity, as well as processing throughput needed for cost efficient manufacturing thereof.

Plasma Processing System Examples

Figure 2A:
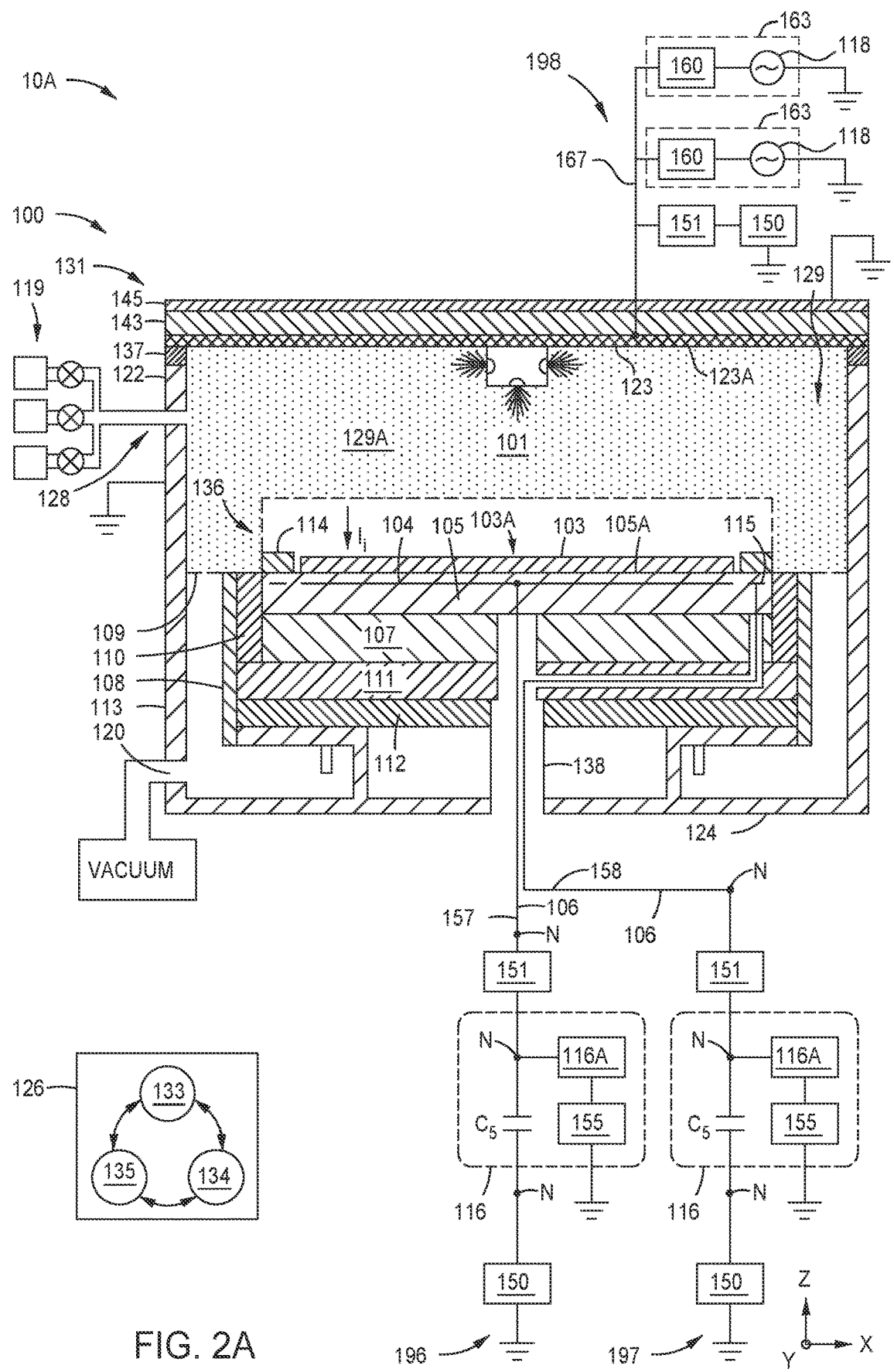
FIGS. 2A-2B are schematic cross-sectional views of process chambers that can be adapted to practice one or more of the methods set forth herein, according to one or more embodiments.
Figure 2B:
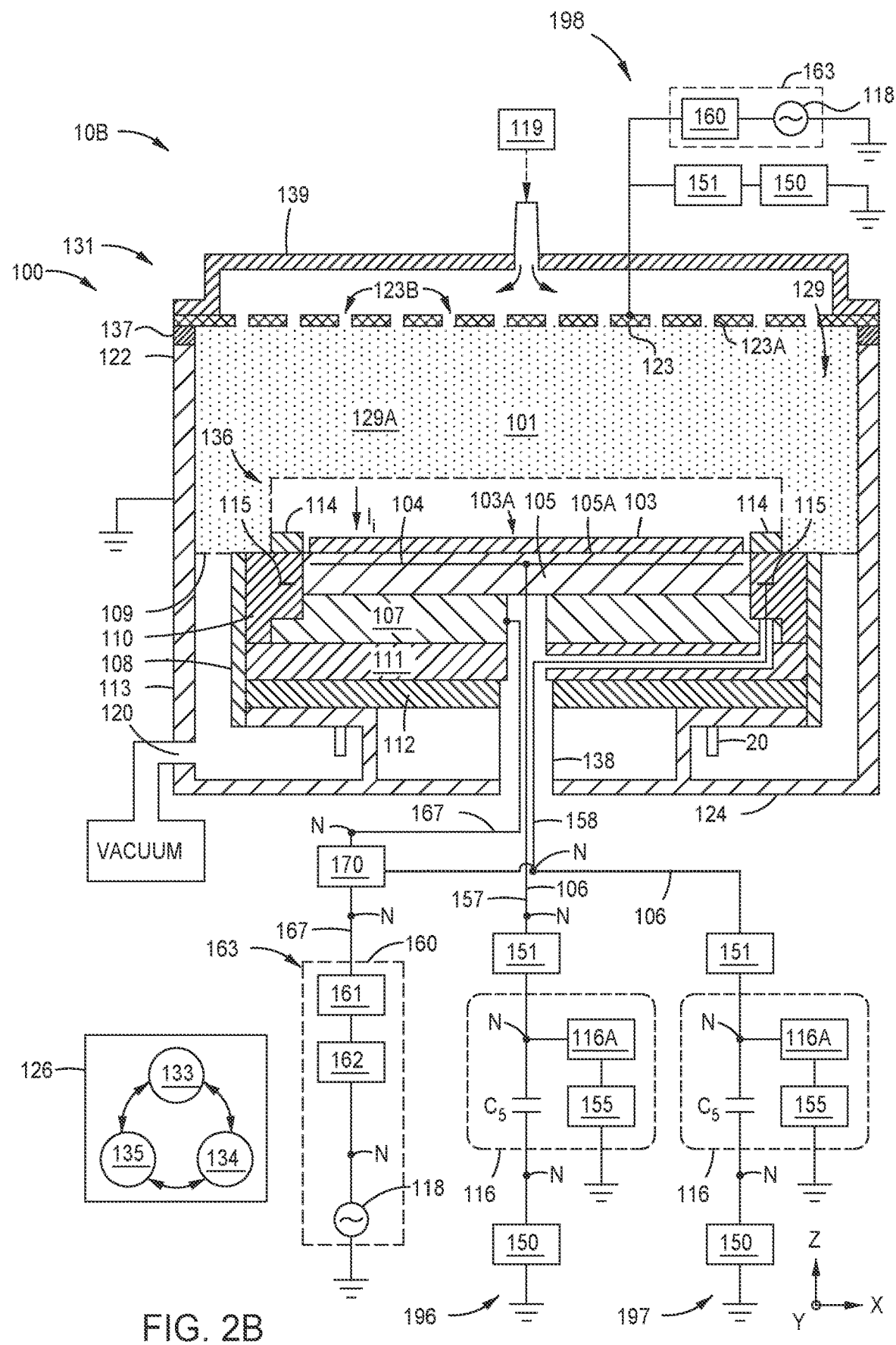

FIGS. 2A and 2B are schematic cross-sectional views of respective processing systems 10A and 10B configured to perform one or more of the plasma processing methods set forth herein. In some embodiments, the processing systems 10A and 10B illustrated in FIGS. 2A and 2B are configured for plasma-assisted etching processes, such as a reactive ion etch (RIE) plasma processing. However, it should be noted that the embodiments described herein may also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown in FIGS. 2A-2B, the processing systems 10A-10B are configured to form a capacitively coupled plasma (CCP), where the processing systems 10A-10B include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a plasma generator assembly 163 is electrically coupled to one of the upper electrode or lower electrode to deliver an RF signal that is used to ignite and maintain a plasma 101 in a processing region 129A disposed over the substrate 103. A plasma generator assembly 163 will generally include an RF generator 118 and RF matching network 160. In some embodiments, the RF generator 118 is configured to deliver an RF signal having a frequency that is greater than 400 kHz, such an RF frequency of about 1 MHz or more, or about 2 MHz or more, such as about 13.56 MHz or more, about 27 MHz or more, about 40 MHz or more. In some configurations, the RF frequency is between about 30 MHz and about 200 MHz, such as between about 30 MHz and about 160 MHz, between about 30 MHz and about 120 MHz, or between about 30 MHz and about 60 MHz.

The processing systems 10A and 10B each include a processing chamber 100, the plasma generator assembly 163, one or more pulsed voltage (PV) source assemblies 196-199, a substrate support assembly 136, and a system controller 126. The processing chamber 100 typically includes a chamber body 113 that includes the chamber lid 123, one or more sidewalls 122, and a chamber base 124, which collectively define the processing volume 129. A substrate 103 is loaded into, and removed from, the processing volume 129 through an opening (not shown) in one of the one or more sidewalls 122, which is sealed with a slit valve (not shown) during plasma processing of the substrate 103. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy. In some embodiments, there is a dielectric coating on the sidewalls 122. The dielectric coating can be anodized aluminum, aluminum oxide, yttrium oxide, mixtures thereof. The thickness of the dielectric coating can vary from 100 nm to 10 cm.

In some embodiments, a gas inlet 128, which is disposed through the chamber lid 123, is used to deliver one or more processing gases to the processing volume 129 from a processing gas source 119 that is in fluid communication therewith. In other embodiments, the gas inlet 128 comprises a showerhead (FIG. 2B) that is used to deliver one or more processing gases, provided from a processing gas source 119, to the processing volume 129. In still other embodiments, the gas is delivered through several nozzles in the sidewalls. The processing volume 129 is fluidly coupled to one or more dedicated vacuum pumps through a vacuum outlet 120, which maintain the processing volume 129 at sub-atmospheric pressure conditions and evacuate processing and/or other gases, therefrom.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10A and/or 10B. Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10A and/or 10B to perform the various process tasks and various process sequences used to implement the methods described herein. In one embodiment, the program includes instructions that are used to perform one or more of the operations described below.

The substrate support assembly 136, which generally includes the substrate support 105 (e.g., electrostatic-chuck (ESC) substrate support) and support base 107, is disposed on a support shaft 138 that is grounded and extends through the chamber base 124. In some embodiments, the substrate support assembly 136 can additionally include an insulator plate 111 and a ground plate 112. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example aluminum, an aluminum alloy, or a stainless steel and is coupled to the substrate support with an adhesive or by mechanical means.

In some embodiments, the process chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a cathode liner 108. In some embodiments, a plasma screen 109 is positioned between the cathode liner 108 and the sidewalls 122 to prevent plasma from forming in a volume underneath the plasma screen 109 between the cathode liner 108 and the one or more sidewalls 122.

The substrate support 105 is typically formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In one configuration, the bias electrode 104 is a chucking pole used to secure (i.e., chuck) the substrate 103 to the substrate support surface 105A of the substrate support 105 and to bias the substrate 103 with respect to the plasma 101 using one or more of the pulsed-voltage biasing schemes described herein. Typically, the bias electrode 104 is formed of one or more electrically conductive parts, such as one or more metal meshes, foils, plates, or combinations thereof.

The processing systems 10A and 10B will also generally include a first PV source assembly 196 for establishing a first PV waveform at the bias electrode 104 and a second PV source assembly 198 (FIG. 2A) or 199 (FIG. 2B) for establishing a second PV waveform and/or an RF waveform at an upper electrode, such as the chamber lid 123. Each of the one or more PV source assemblies 196-199 may include a PV waveform generator 150, and an RF filter assembly 151. In one embodiment, as shown in FIG. 2A, the second PV source assembly 198 further includes at least one plasma generator assembly 163. In some embodiments, the PV waveform generator 150, and an RF filter assembly 151 within the second PV source assembly 198 (FIG. 2A) or 199 (FIG. 2B) is replaced by a second plasma generator assembly 163 that is configured to operate at the same frequency as the first PV source assembly 196. In some embodiments, the PV source assemblies 196 and 197 additionally include a clamping network 116 that is used to "clamp" or "chuck" the substrate 103 to the substrate support surface 105A of the substrate support 105. An RF filter assembly 151 is configured to block the RF signal generated by the plasma generator assembly 163 and the second RF generator assembly in some embodiments, and any associated harmonics, from making their way to the PV waveform generators 150 disposed within each of the one or more PV source assemblies 196-199. In some embodiments, the chamber lid 123 and substrate support assembly 136 are configured in a parallel plate like configuration, such that the surface 123A of the chamber lid 123 is substantially parallel to the substrate support surface 105A of the of the substrate support assembly 136. In some alternate embodiments, the chamber lid 123 has a low angled concave conical shape or slightly curved concave shape relative to the flat substrate support assembly 136, which is centered about the center of chamber lid 123.

The overall control of the delivery of the PV waveform from each of the PV waveform generators 150 within the one or more PV source assemblies 196-199 is controlled by use of signals provided from the system controller 126. In one embodiment, a PV waveform generator 150 is configured to output a periodic voltage function at time intervals of a predetermined length by use of a signal from a transistor-transistor logic (TTL) source disposed within the system controller 126. In one embodiment, a PV waveform generator 150 is configured to maintain a predetermined, substantially constant negative voltage across its output (i.e., to ground) during regularly recurring time intervals of a predetermined length, by repeatedly closing and opening one or more switches at a predetermined rate. In one example, during a first stage of a pulse interval a first switch is used to connect a high voltage supply to the bias electrode 104, and during a second stage of the pulse interval a second switch is used to connect the bias electrode 104 to ground. In another embodiment, the PV waveform generator 150 is configured to maintain a predetermined, substantially constant voltage across its output (i.e., to ground) during regularly recurring time intervals of a predetermined length, by repeatedly closing and opening one or more internal switches (not shown) at a predetermined rate.

In an effort to efficiently deliver an RF signal from the RF generator 118 to one or more electrodes within the processing chamber 100 and also protect the RF generator 118, the RF generator assembly 160 includes an RF matching circuit 162 and a first filter assembly 161. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from PV waveform generators 150, and thus inhibits the flow of current to the RF matching circuit 162 and RF generator 118.

Referring to FIGS. 2A and 2B, the substrate support assembly 136 may further include the edge control electrode 115 that is positioned below the edge ring 114 and surrounds the bias electrode 104 and/or is disposed a distance from a center of the bias electrode 104 and center of the substrate support surface 105A. In some embodiments, the a processing system 10A or 10B may thus include a first PV source assembly 196 for establishing a first PV waveform at a bias electrode 104, a second PV source assembly 198 or 199 for establishing a PV waveform and/or RF waveform at the top electrode (e.g., chamber lid 123), and a third PV source assembly 197 for establishing a second PV waveform at an edge control electrode 115. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 2A, the edge control electrode 115 is positioned within a region of the substrate support 105. In some embodiments, as illustrated in FIG. 2A, the edge control electrode 115 includes a conductive mesh, foil, and/or plate that is disposed a similar distance (i.e., Z-direction) from the substrate support surface 105A of the substrate support 105 as the bias electrode 104. In some other embodiments, such as shown in FIG. 2B, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

As noted above, in some embodiments, the bias electrode 104 and edge control electrode 115 are each electrically coupled to a clamping network 116, which provides a chucking voltage thereto, such as static DC voltage between about −5000 V and about 10,000 V, using an electrical conductor, such as the coaxial power delivery line 106 (e.g., a coaxial cable). Applying similarly configured PV waveforms to the bias electrode 104 and edge control electrode 115 can help improve the plasma uniformity across the surface of the substrate during processing and thus improve the plasma processing process results. Adjusting the edge PV voltage can reduce the feature tilt at wafer extreme edge and increase the MTBC of process kit. The application of a sufficient clamping voltage to the bias electrode 104 and edge control electrode 115 can facilitate the temperature control of the substrate and the edge ring. The clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a PV waveform generator 150 and the bias electrode 104 or the edge control electrode 115.

The edge control electrode 115 can be biased by use of a second PV waveform generator 150 that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a third PV source assembly 197 is configured to bias the edge control electrode 115.

In some embodiments, as shown in FIG. 2B, the edge control electrode 115 is generally positioned so that when used with the edge tuning circuit 170 is used to affect or alter a portion of the generated plasma 101 that is over or outside of the circumferential edge of the substrate 103. In some embodiments, the edge tuning circuit 170, electrically coupled to the edge control electrode 115, may be used to manipulate one or more characteristics of the RF power used to ignite and/or maintain the plasma in the processing region 129A over the edge control electrode 115. For example, in some embodiments, the edge tuning circuit 170 may be used to adjust and/or manipulate one or more of the voltage, current, and/or stage of the RF power used to ignite and/or maintain the plasma 101 in the processing region disposed between the edge control electrode 115 and the chamber lid 123. In some embodiments, as shown in FIG. 2B, the edge tuning circuit 170 is electrically coupled between the edge control electrode 115 and the plasma generator assembly 163. In some embodiments, the edge tuning circuit 170 is configured as a resonant circuit that includes an inductor and a capacitor (e.g., an LC circuit) that is used to adjust the characteristics of the RF power used to maintain the plasma in the processing region 129A. In one embodiment, the edge tuning circuit 170 includes an inductor and a variable capacitor that arranged in parallel (i.e., a parallel LC resonant circuit). In another embodiment, the inductor and the variable capacitor are arranged in series (i.e., a serial LC resonant circuit). The type of LC resonant circuit, e.g., parallel or serial, selected for the edge tuning circuit 170 may depend on the desired distribution of plasma density over the substrate support assembly 136, such as from center to edge of the substrate support assembly 136 and/or over the circumferential edge of the substrate 103.

Referring to FIG. 2A, in some embodiments, an upper electrode assembly 131 includes the upper electrode (e.g., chamber lid 123), an electrode insulator 143 and an upper ground plate 145. The upper electrode 123 is positioned on, and electrically isolated from, the grounded wall 122 by a lid insulator 137. In FIG. 2A, an upper electrode, such as the chamber lid 123, is electrically coupled to at least one plasma generator assembly 163, which configured to ignite and maintain a plasma 101 in a processing region therebetween. In some embodiments, the plasma generator assembly 163 is generally configured to deliver a desired amount of a continuous wave (CW) or pulsed RF power at a desired substantially fixed sinusoidal waveform frequency to the chamber lid 123 based on control signals provided from the system controller 126. In this configuration, the processing gas source 119 can be configured deliver one or more process gases to the process region 129A through one or more ports formed in the grounded wall 122, as shown in FIG. 2A.

In some alternate embodiments, the upper electrode assembly 131 includes the upper electrode (e.g., chamber lid 123) and a lid plate 139, which are configured to form a showerhead that is configured to evenly distribute one or more gases provided from the processing gas source 119 to the process region 129A through a plurality of holes 123B formed in the upper electrode. The upper electrode assembly 131 is also positioned on, and electrically isolated from, the grounded wall 122 by a lid insulator 137. While the second PV source assemblies 199 is illustrated in FIG. 2B with the showerhead type of upper electrode assembly 131, this configuration is not intended to be limiting as to scope of the disclosure provided herein since either of the second PV source assemblies 198 or 199 can be used with any of the various upper electrode assembly 131 configurations disclosed herein.

As shown in FIG. 2B, one or more components of the substrate support assembly 136, such as the support base 107, is electrically coupled to the plasma generator assembly 163. In some embodiments, the plasma generator assembly 163 is generally configured to deliver a desired amount of a continuous wave (CW) or pulsed RF power at a desired substantially fixed sinusoidal waveform frequency to the support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. Also, as shown in FIG. 2B, the upper electrode may also be electrically coupled to at least one plasma generator assembly 163, which configured to ignite and maintain a plasma 101 in a processing region therebetween, or provide a low frequency RF signal as discussed further below.

Waveform Examples

It has been found that the delivery PV waveform(s) to the bias electrode 104 and edge control electrode 115 during plasma processing can be used to desirably control the sheath voltage across the surface and edge of the substrate during plasma processing. The ability to control and maintain a nearly constant sheath voltage throughout a large portion of a PV waveform cycle (e.g., "ion current stage" in FIG. 3) allows for the formation of a desirable ion energy distribution function (IEDF) at the surface of the substrate during a significant part of the one or more plasma processing operations. The delivery of PV waveform to the bias electrode 104 and edge control electrode 115 is used to improve the plasma processing results by allowing the population of ions that are accelerated towards the surface of the substrate to be contained within one or more (narrow) IEDF peaks depending on the types and number of PV waveforms provided to the electrodes. The control of the IEDF can also be beneficial to help reduce the amount of trapped charge, or effect of the trapped charge, found in the high aspect ratio features by tightly controlling the magnitude and range ion energies during plasma processing.

Figure 3:
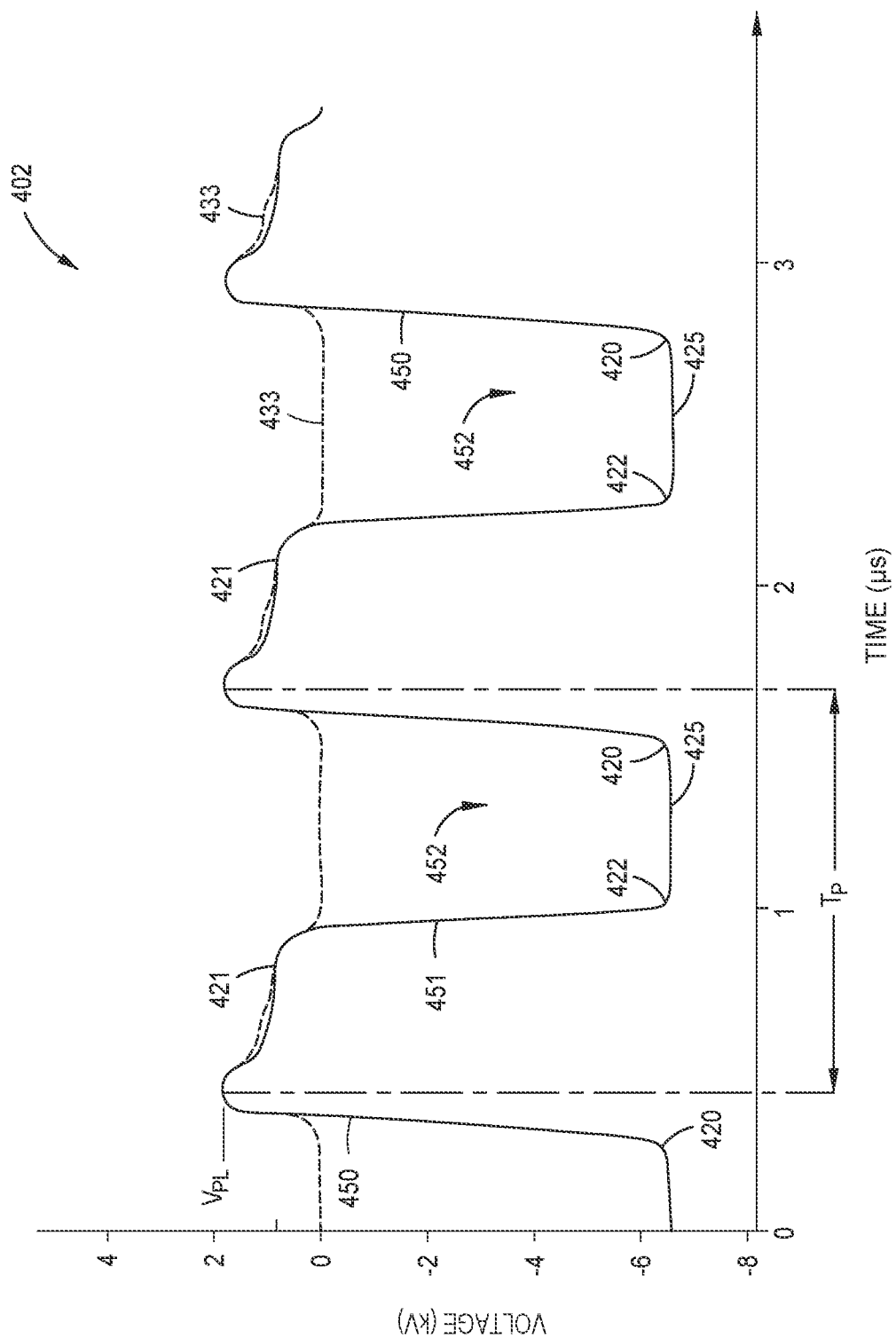
FIG. 3 illustrates examples of pulsed voltage (PV) waveforms that can be established at a surface of a substrate using one or more of the embodiments described herein.

FIG. 3 illustrates an example of a multistage series 402 of PV waveforms 425 established at a substrate 103 due to a PV waveform 401 (FIG. 4A) that is established at the bias electrode 104 based on PV waveforms generated by the PV waveform generator 150. The PV waveform 401 established at the bias electrode 104 and edge control electrode 115 is shown as a multistage series 490 in FIG. 4A. The PV waveform 401 can be established at the bias electrode 104 and edge control electrode 115 by use of the PV waveform generator 150 within the respective PV source assemblies 196 and 197, and a DC power supply 155 of the corresponding clamping network 116. Generally, the output of the PV waveform generator 150, which can be controlled by a setting in a plasma processing recipe stored in the memory of the system controller 126, forms the PV waveform 401, which includes a peak-to-peak voltage referred to herein as the pulse voltage level $V_{pp}$. Based on power delivery line inductance(s) and series capacitances, and stray capacitances the peak-to-peak pulse voltage level $V_{pp}$ established at the various electrodes will be similar to, but actually different from the output of the PV waveform generated by the PV waveform generator 150 (e.g., output voltage $V_{OUT}$).

The PV waveform 425, which has a waveform period $T_P$, is characterized as including a sheath collapse and recharging stage 450 that extends between point 420 and point 421, a sheath formation stage 451 that extends between point 421 and point 422, and an ion current stage 452 that extends between point 422 and back to the start at point 420 of the next sequentially established pulse voltage waveform. For ease discussion herein, the sheath collapse and recharging stage 450 and the sheath formation stage 451 primarily occur within a first region 405 of the PV waveform 425, while the ion current stage 452 primarily occurs within a second region 406 of the PV waveform 425. The sheath collapse stage portion of the sheath collapse and recharging stage 450 generally includes a time period where the capacitance of the sheath is discharged and the bulk plasma comes in contact with the substrate surface. The electrons in the bulk plasma neutralize the excess positive charges on the substrate surface and inside features which are deposited by ion flux and/or secondary electron flux during ion current stage. In some embodiments, injection or accumulation of negative charges on the substrate surface during the sheath collapse and recharging stage 450 is also possible. The plasma current during the recharging stage portion is also carried by electrons, namely, in the absence of the cathode sheath, the electrons reach the substrate and build up the surface charge. The sheath formation stage 451 generally includes a negative voltage jump to charge the processing chamber's stray capacitor, re-form the sheath and set the value of the sheath voltage ($V_{SH}$). The ion current stage 452 is generally a long (e.g., >50%, such as about 80-90% of the PV waveform cycle) stage of the PV waveform, which is associated with the generation of high-energy ions, due to the formed sheath, that are used to perform the plasma etching process performed on a substrate 103. However, the generated ion current causes accumulation of positive charge on the substrate surface and gradually discharges the sheath and chuck capacitors, slowly decreasing the sheath voltage drop and bringing the substrate potential closer to zero. This results in the voltage droop in the substrate PV waveforms 425 (FIG. 3). The generated sheath voltage droop is a reason why the pulse waveform(s) needs to move to the next PV waveform cycle.

Depending on the desired plasma processing conditions, it may be desirable to control and set at least the PV waveform characteristics, such as PV waveform frequency ($1/T_P$), pulse voltage level $V_{pp}$, pulse voltage on-time, and/or other parameters of the PV waveform 401 to achieve desirable plasma processing results on a substrate. In one example, pulse voltage (PV) on-time, which is defined as the ratio of the ion current time period (e.g., time between point 422 and the subsequent point 420 in FIG. 3) and the waveform period $T_P$, is greater than 50%, or greater than 70%, such as between 80% and 95%.

FIG. 4B illustrates an alternate type of PV waveform in which the PV waveform generator 150 is configured to control the generation of a multistage series 491 of multistage shaped PV waveforms 441 that are established at the bias electrode 104 and edge control electrode 115. In some embodiments, the multistage shaped PV waveform 441 is formed by a PV waveform generator 150 that is configured to supply a positive voltage during one or more stages of a voltage pulse (e.g., first region 405) and a time-varying negative voltage during one or more stages of the voltage pulse (e.g., second region 406) by use of one or more internal switches and DC power supplies.

In some embodiments, as illustrated in FIG. 4C, the PV waveform generator 150 is configured to provide an alternate series 492 of multistage positive PV waveforms 431 to the bias electrode 104 and edge control electrode 115. Each positive pulse in the positive PV waveform 431 can include multiple stages, such as a sheath collapse stage, recharging stage, a sheath formation stage and an ion current stage. In some embodiments, the multistage positive PV waveforms 431 includes a series of repeating cycles, such that a waveform within each cycle has a first portion that occurs during a first time interval and a second portion that occurs during a second time interval. The multistage positive PV waveforms 431 will also include a positive voltage that is only present during at least a portion of the first time interval, and the multistage positive PV waveforms 431 is substantially constant during at least a portion of the second time interval. An output of the PV waveform generator 150 is connected to a positive voltage supply for at least a portion of a first time interval.

The various PV waveforms 401, 441 and 431 illustrated in FIGS. 4A, 4B and 4C, respectively, are representative of pulse voltage waveforms that can be established at a node N connected to the input of the clamping network 116, and thus may differ from the pulse voltage waveforms that is established at the bias electrode 104 and edge control electrode 115. The DC offset ΔV found in each PV waveform is dependent on the bias applied by the DC power supply 155 in the clamping network 116 and various properties of the PV waveform generator 150 configuration used to establish the PV waveform. In general, the pulsed voltage waveforms established the electrodes 104 and 115, e.g., negative PV waveforms 401, shaped PV waveforms 441 or positive PV waveforms 431, can have waveform period $T_P$ can be between about 1 μs and about 5 μs, such as about 2.5 μs. In some embodiments, the pulsed voltage waveforms have a frequency between about 1 kHz and about 1 MHz, or about 400 kHz, such as about 1 MHz or less, or about 500 kHz or less. In some embodiments, the pulse waveform frequency may range between about 10 kHz and about 500 kHz, or between about 50 kHz and 400 kHz, or even between about 50 kHz and 200 kHz.

Trapped Charge Reducing Methods

As discussed briefly above, apparatus and methods disclosed herein are used to prevent or reduce the effect of trapped charges, disposed within features formed on a substrate. In some embodiments, the method includes synchronizing the delivery of pulsed-voltage (PV) waveforms to cause the generation of electrons, during one or more stages of a PV waveform cycle, to neutralize the trapped charges found in the features formed on the substrate. In an alternate embodiment, the method includes synchronizing the delivery of a PV waveform and a radio frequency (RF) waveform to cause the generation of electrons, during one or more stages of a PV waveform cycle, to neutralize the trapped charges in the features formed on the substrate.

Figure 5A:
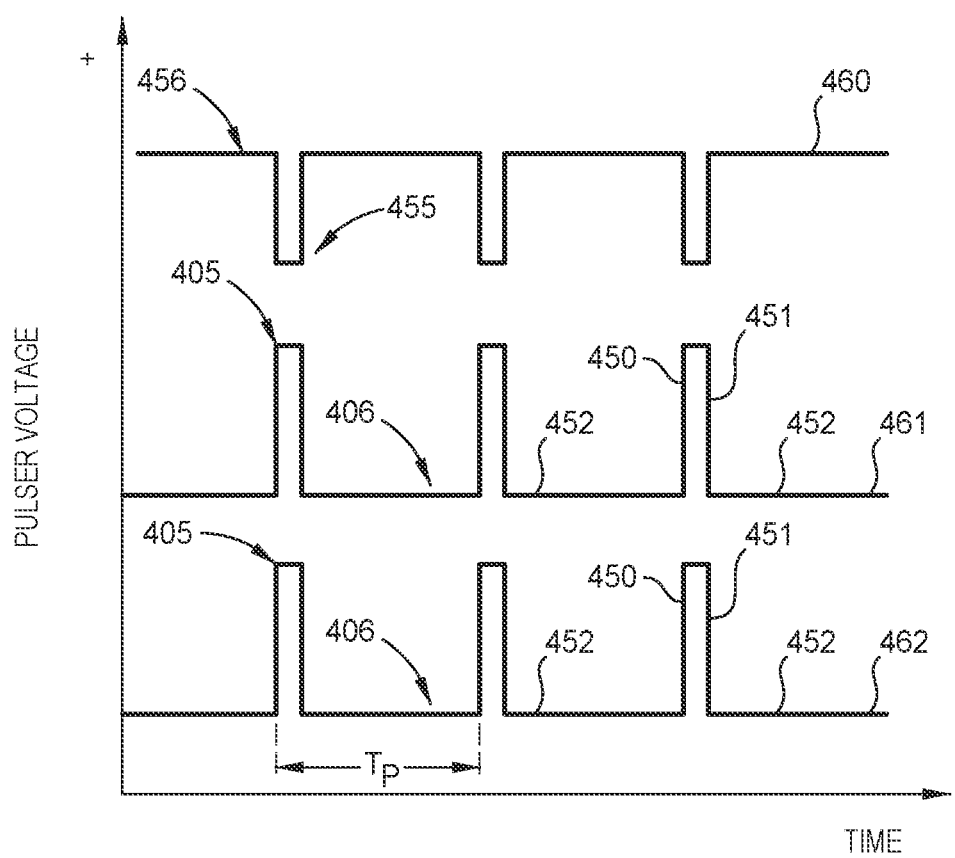
FIG. 5A illustrates synchronized pulsed voltage (PV) waveforms that can be established at electrodes within a process chamber using one or more of the embodiments described herein.

FIG. 5A illustrates three synchronized PV waveforms 460, 461, and 462 that are provided to the chamber lid 123, bias electrode 104 and edge control electrode 115 by use of the second PV source assembly 198, 199, first PV source assembly 196 and third PV source assembly 197, respectively. In one embodiment, the PV waveforms 461 and 462, which are provided to bias electrode 104 and edge control electrode 115, respectively, include PV waveforms that have identical waveform characteristics, such as the PV on-time, pulse voltage level $V_{pp}$, and waveform period $T_P$. In another embodiment, the PV waveforms 461 and 462 include PV waveforms that have identical waveform characteristics, except for a differing pulse voltage level $V_{pp}$ that is applied to the PV waveforms in a series of PV waveform pulses provided to each of the electrodes. The PV waveforms 461 and 462 may include a PV waveform shape that is similar to the PV waveforms 401, 431 or 441, which are described above in relation to FIGS. 4A-4C.

As shown in FIG. 5A, the PV waveform 460 applied to the upper electrode is synchronized with the delivery of the PV waveforms 461 and 462. However, the PV waveform characteristics of the PV waveform 460 are desirably different from the PV waveforms characteristics of the PV waveforms 461 and 462. In some embodiments, as shown in FIG. 5A, the PV waveform 460 is an inverse of, or is "oppositely configured", from the PV waveforms 461 and 462. In other words, during the low voltage state of PV waveform 460, found within the first stage 455 of the PV waveform 460, coincides with the high-voltage states formed during the first stage 405 of the PV waveforms 461 and 462, and the high-voltage state of PV waveform 460, which is provided in the second stage 456 of the PV waveform 460, coincides with the low-voltage states formed during the second stage 406 of the PV waveforms 461 and 462. In some embodiments, there could be a controlled time lag between the beginning of stages 455 and 405, and/or between the end of the stages 455 and 405, such as the stage 455 can be embedded in stage 405, or the stage 405 can be embedded in stage 455.

The delivery of the inversely configured PV waveform 460 will increase the sheath voltage formed at the surface of the top electrode (e.g., chamber lid 123) during the first stage 455 of the PV waveform 460. Higher sheath voltages will cause the ions to be accelerated to higher energies during the process of bombarding the surface of top electrode, and thus generate secondary electrons, during the first stage 455. Secondary electrons are generated when ions bombard and impact the top electrode surface, with the secondary electron yield, caused by the ion collisions, being dependent on the incident ion energy. In the incident ion energy range of a few hundred to a few thousands of electron-volts (eV), the secondary electron yield increases with incident ion energy. Therefore, due to the higher sheath voltages at top electrode during stage 455 results in more secondary electron generation from the top electrode during stage 455. The secondary electrons are accelerated towards the substrate by the sheath voltage created at the top electrode. With higher sheath voltage, the generated secondary electrons gains more velocity perpendicular to the substrate, so that the angular distribution of these secondary electrons are more centered around zero degrees (0°) from an axis that is oriented normal to the surface of the upper electrode, and thus more electrons can go deep into the feature to neutralize positive charges inside the feature formed on the substrate. The total secondary electrons emitted from the top electrode during one pulse period $T_P$ will generally depend on the duration of the first stage 455, the pulse voltage of the PV waveform 460, the material properties of the material exposed to the ion flux and the gas composition used to form the plasma 101 within the process chamber.

In some embodiment, the voltage slope or pulse rise/fall time at the beginning of stage 455 and 405 can be set differently. Having a sharp voltage rise slope during stage 405 can induce fast substrate sheath collapse. In some plasma processing conditions, such as at low pressures (<10 mT), high substrate sheath thicknesses and/or the use of electronegative gas chemistries, the bulk plasma resistance is relatively high during the fast substrate sheath collapse period because the electron density is low and the inertia of the electrons tends to inhibit the rapid response to fast substrate voltage increase. The fast substrate voltage increase induces a strong transient electric field above the substrate surface that will cause the acceleration of the bulk electrons towards the substrate. As bulk electrons are accelerated across the strong transient electric field region, they can gain up to hundreds or thousands of electron-volts (eV) of energy and become highly directional towards the substrate, which is another source of highly directional electrons that will go deep inside the feature formed on the substrate to neutralize positive residual charges formed therein. Thus, in some embodiments, the generated secondary electrons, which can gain energies up to 3 keV, are highly directional towards the substrate surface. Separately, during the low-voltage state of PV waveforms 461 and 462, a sheath forms over the surface of the substrate (e.g., ion current stage 452), which causes the accelerating ions to bombard and etch the surface of the substrate 103.

In some embodiments, the highly energetic and directional electrons can also be utilized to promote crosslinking of top mask material formed on the surface of the substrate, which can consist of cross-linked carbon and maybe some dopants, such as silicon, nitrogen, and oxygen. The highly energetic and directional electrons provide enough energy to create active atomic sites and then form new chemical bonds within the mask material, which improves the etching resistivity of the mask to the plasma and the selectivity of etching material to the mask.

In some embodiments, the highly energetic electrons can also be utilized to improve the selectivity of etching material to etching stop layer. Since the highly directional electrons can go deep to reach the bottom of the feature, they can modify the chemical states of the top etching stop layer once the etching stop layer is exposed to the plasma. The modified etching stop layer can have higher resistance to being etched by the plasma and thus increased etch selectivity. Such selectivity is particularly useful for etching complicated 3D structures, such as staircase, where there are several etching stop layers at different depth of different trenches.

Figure 5B:
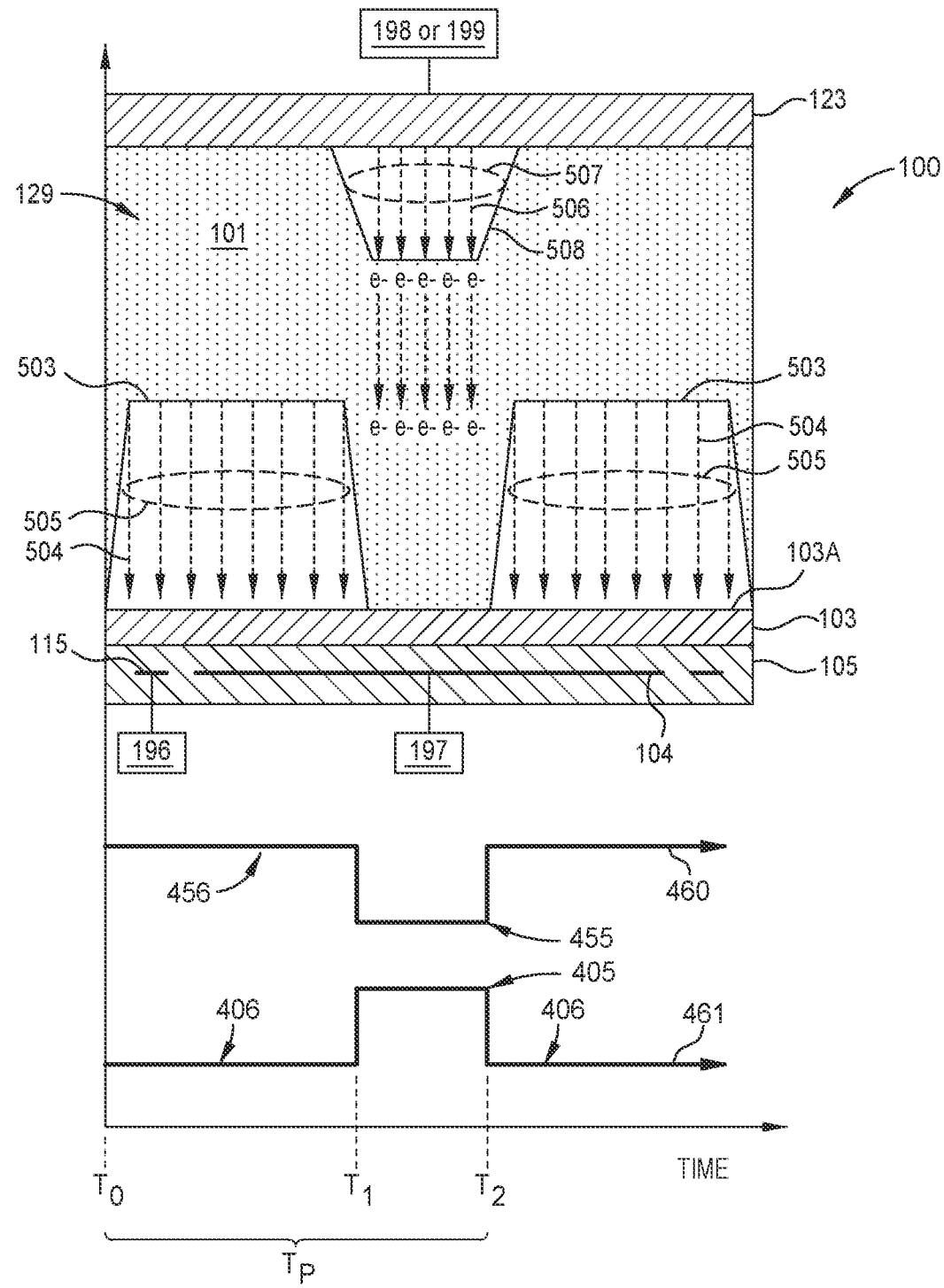
FIG. 5B is a simplified schematic of the processing chamber that includes an overlaid representation of PV waveforms that are applied to electrodes within the process chamber, according to one or more embodiments provided herein.

FIG. 5B illustrates a simplified schematic of the processing chamber 100 that also includes an overlaid representation of a PV waveform cycle for the PV waveforms 460 applied to the upper electrode (e.g., chamber lid 123) and the PV waveforms 461 applied to the bias electrode 104. For simplicity of discussion, the PV waveform 462 has been omitted from FIG. 5B, but may also be simultaneously applied to the edge control electrode 115. As illustrated in FIG. 5B, during the second region 406 of the PV waveform 461 and second region 456 of the PV waveform 460 a sheath 503 is formed over the surface of the substrate 103 that allows ions 504 provided within a positive ion flux 505 to bombard the surface 103A of the substrate 103. The process of bombarding the surface of the substrate during the ion current stage 452 will last for a time period that extends between time $T_0$ and time $T_1$. The positive charge will be deposited within the feature on the substrate 103 during this stage. The bias applied to the bias electrode 104 is controlled by the peak-to-peak voltage $V_{PP}$ and the pulse voltage on-time generated by the PV waveform generator 150 in the first and second PV source assemblies 196 and 198, which controls the sheath thickness and sets the ion energy used to bombard the surface 103A of the substrate 103. In some embodiments, the PV waveform generator 150 is set to provide pulses having a pulse voltage level (e.g., $V_{pp}$) from 0.01 kV to 10 kV to the bias electrode 104 and edge control electrode 115.

During the first region 405 of the PV waveform 461 and first region 455 of the PV waveform 460 a sheath 508 is formed over the surface of the upper electrode (i.e., chamber lid 123) that allows ions provided within a generated ion flux to bombard the surface of the upper electrode, which generates secondary electrons 506 that are contained within an electron flux 507. The process of bombarding the surface of the upper electrode will last for a time period that extends between time $T_1$ and time $T_2$, as shown in FIG. 5B. The first region 405 and 455 can have a period that is between 5% and 50% of the pulse period $T_P$. In one example, the first region 405 and 455 can have a period that is between 50 nanoseconds (ns) and 1000 ns. In some embodiments, the PV waveform generator 150 within the second source assembly is set to provide pulses having a pulse voltage level (e.g., $V_{pp}$) from 0.01 kV to 5 kV to the upper electrode (e.g., chamber lid 123). The energy provided to generated electrons, due to the formation of the sheath 508, then causes the electrons to travel to and interact with and neutralize the trapped positive charges deposited within the features formed on the surface of the substrate 103 during stages 456 and 406 of the PV waveform 460 and 461 waveform cycles. Also, in some embodiments, due to a parallel plate like upper electrode to substrate support surface 105A configuration, and formation of the sheath 508 over the upper electrode surface (i.e., the surface 123A of the chamber lid 123), the generated secondary electrons are accelerated by the voltage of the sheath 508 in a direction that is perpendicular to the substrate surface 103A, such as the vertical direction shown in FIG. 5B. The generation of desirably oriented electron flux will promote the delivery of the electrons to the lower portion, or deeper portion, of the etched features formed in the surface of the substrate. The directional nature of the generated secondary electrons will further allow the generated electrons to travel to, and interact with, and neutralize the trapped positive charge deposited within the features formed on the surface of the substrate 103 during stage 406 of the PV waveform cycle.

In some embodiments, the duration of time of the first region 405 of the PV waveforms 461 is substantially equal to the duration of time of the first region 455 of the PV waveforms 460. Therefore, in some embodiments, the first region 405 of the PV waveforms 461 is synchronized with the first region 455 of the PV waveforms 460, such that the start of the first region 455 of the PV waveforms 460 and the start of the first region 455 of the PV waveforms 460 are substantially initiated at the same time and the first regions 455 and 405 have substantially the same time duration. However, in some embodiments, the first region 405 of the PV waveforms 461 is offset in time from the first region 455 of the PV waveforms 460, such that the first region 455 of the PV waveforms 460 and the first region 455 of the PV waveforms 460 partially overlap in time. In some cases, such as the case where there is an offset in time between generation of the first regions 455 and 405, it may be desirable for the duration of time of the first region 405 of the PV waveforms 461 to be less than or greater than the duration of time of the first region 455 of the PV waveforms 460.

In some embodiments, it is desirable to select the material of the upper electrode that is exposed to the ion flux so that the generation of secondary electrons produced at the upper electrode surface is maximized. In some embodiments, the exposed surface of the upper electrode is formed from a conductive material or semiconductor material or dielectric material selected from a group comprising a metal, a semiconductor material, and doped semiconductor material, or combination thereof. In one example, the material that is exposed at the upper electrode surface of the upper electrode is a silicon containing material, such as an amorphous or a crystalline silicon (Si), silicon carbide (SiC), silicon nitride ($SiN_x$) or a moderately or heavily doped silicon material. In another example, the material that is exposed at the upper electrode surface of the upper electrode is a material that includes graphite, germanium (Ge), gallium (Ga) or combination thereof, or doped version thereof. In another example, the material that is exposed at the upper electrode surface of the upper electrode is a material that includes metal, such as aluminum (Al), tungsten (W), titanium (Ti), molybdenum (Mo), or nickel (Ni), or combination thereof. In another example, the material that is exposed at the upper electrode surface of the upper electrode is a material that includes dielectrics, such as silicon oxide, silicon nitride, aluminum oxide, aluminum nitride, yttrium oxide, zirconia oxide, or combination thereof.

In general, it is desirable to control the amount of energy provided to the ions that bombard the surface of upper electrode and also select a material that will not contaminate the substrate by generating ion assisted chemical etch by-products or physical sputtering by-products which can deposit on the substrate surface during the time period defined by the first region 405 of the PV waveform 461 and the first region 455 of the PV waveform 460. In some embodiments, it is desirable to select an upper electrode material that is similar to the materials that is being etched on the substrate. In some embodiments, it is desirable to select an upper electrode material that only generates by-products which are volatile enough, within normal processing conditions (pressure and substrate temperature), so that negligible by-products will be deposited on the substrate surface. In some embodiments, it is desirable to select a processing chemistry which is polymerizing enough to form a coating on the upper electrode surface so that the ion assisted chemical etching reaction mostly occurs in the polymer coating layer and the bulk upper electrode material is protected from erosion.

In some embodiments, it is also desirable to select and/or adjust the process gas composition to control the secondary electron generation process. In one example, the process gas comprises nitrogen ($N_2$), oxygen ($O_2$), sulfur ($NF_3$ or $SF_6$) or a fluorine containing gas (e.g., $NF_3$, $F_2$, $C_4F_6$, $C_3F_6$) could be used to react with the upper electrode surface (e.g. Si or SiC) and form a top layer of new material on the upper electrode which has higher secondary electron emission coefficient. The process gas may also include an inert gas, such as argon (Ar), krypton (Kr) and neon (Ne). In another example, the plasma etching process comprises polymerizing process gases such as $C_4F_6$, $C_4F_8$, $C_3F_6$, $C_3H_2F_4$, and $CH_2F_4$ could be used to form a polymer coating on upper electrode surface which has higher secondary electron emission coefficient than the bulk upper electrode material. In one example, the plasma etching process includes delivering a process gas that has a composition formed by creating a $C_4F_6$ gas flowrate to $C_3F_6$ gas flowrate ratio of about 4, a $C_4F_6$ gas flowrate to $O_2$ gas flowrate ratio of about 0.8, a $C_4F_6$ gas flowrate to $N_2$ gas flowrate ratio of about 1.1, at a chamber pressure of between about 1 mTorr and 40 mTorr After one PV waveform cycle has been completed, a plurality of additional PV waveform cycles will be serially repeated multiple times, as illustrated in FIG. 5B by the partial illustration of the repeated second region 406 of the PV waveform 461 and second region 456 of the PV waveform 460. In some embodiments, a PV waveform that has a waveform period $T_P$ of about 2.5 µs is serially repeated within a PV waveform burst that has a burst period that is between about 100 microseconds (µs) and about 10 milliseconds (ms). The burst of PV waveforms can have a burst duty cycle that is between about 5%-100%, such as between about 30% and about 95%, wherein the duty cycle is the ratio of the burst period divided by the burst period plus a non-burst period (i.e., no PV waveforms are generated) that separates the burst periods.

Figure 6A:
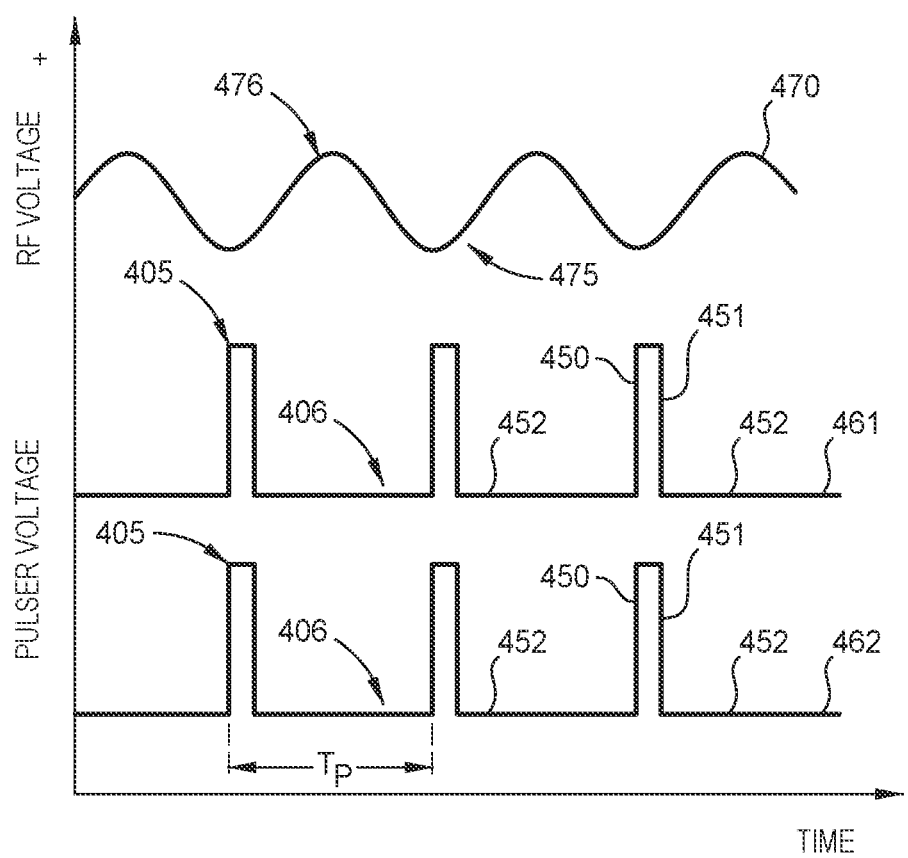
FIG. 6A illustrates synchronized RF and pulsed voltage (PV) waveforms that can be established at electrodes within a process chamber using one or more of the embodiments described herein.

In an alternate configuration, as shown in FIG. 6A, two PV waveforms 461 and 462 are applied to bias electrode 104 and edge control electrode 115 by use of the first PV source assembly 196 and third PV source assembly 197, respectively, and are synchronized with RF waveform 470 that is provided to the chamber lid 123 by an RF generator assembly 163. As similarly discussed above, the PV waveforms 461 and 462 can include PV waveforms that have identical or nearly identical waveform characteristics, and have a PV waveform shape that is similar to the PV waveforms 401, 431 or 441.

As shown in FIG. 6A, the RF waveform 470 is synchronized with the delivery of the PV waveforms 461 and 462. The RF waveform 470 can include sinusoidal waveform that has a frequency that matches the frequency of the PV waveforms 461 and 462. In one example, the RF waveform 470 and PV waveforms 461 and 462 have a frequency ($1/T_P$) that is less than about 1 MHz, such as between about 50 kHz and 500 kHz. As illustrated in FIG. 6A, the RF waveform 470 has an inverse shape, or "oppositely configured" waveform shape, from the PV waveforms 461 and 462. As shown in FIG. 6A, the low point in the sinusoidal waveform (i.e., trough of the RF waveform) coincides with the high-voltage states formed during the first region 405 of the PV waveforms 461 and 462, and the high-voltage point of RF waveform 470 (i.e., peak of the RF waveform), coincides with the low-voltage states formed during the second region 406 of the PV waveforms 461 and 462. In some embodiments, the duration of time of the first region 405 of the PV waveforms 461 is substantially equal to the duration of time of the first region 475 of the RF waveforms 470. In one example, the duration of time of the first region 405 of the PV waveforms 461 is equal to the duration of half of the period of the RF waveforms 470. In some embodiments, the first region 405 of the PV waveforms 461 is offset in time from the first region 475 of the RF waveforms 470, such that the first region 455 of the PV waveforms 460 and the first region 475 of the RF waveforms 470 partially overlap in time.

The delivery of the inversely configured RF waveform 470 will contribute to a sheath 608 of larger sheath voltage to form at the surface of the top electrode (e.g., chamber lid 123) during the low-points in the RF waveform 470. Higher sheath voltages accelerate ions to higher energies during the stage where bombarding the surface of top electrode occurs. Secondary electrons are generated due to ions bombarding the top electrode surface, with the secondary electron yield being dependent on the incident ion energy. In the incident ion energy range of a few hundred to a few thousands of electron-volts (eV), the secondary electron yield increases with incident ion energy. Therefore, due to the higher sheath voltages at top electrode during stage 475 results in more secondary electron generation from the top electrode during stage 475. The secondary electrons are accelerated towards the substrate by the sheath voltage near the top electrode. With higher sheath voltage, the secondary electrons will desirably gain more velocity in a direction that perpendicular to the substrate, so that the angular distribution of these secondary electrons are more centered around zero degrees, and thus more electrons can go deep into the feature to neutralize positive charges inside the feature on the substrate. Having a sharp voltage rise slope of stage 405 can induce fast substrate sheath collapse. In some plasma processing conditions, such as at low pressures (<10 mT), high substrate sheath thicknesses and/or the use of electronegative gas chemistries, the bulk plasma resistance is relatively high during the fast substrate sheath collapse period because the electron density is low and the inertia of the electrons tends to inhibit the rapid response to fast substrate voltage increase. The fast substrate voltage increase induces a strong transient electric field above the substrate surface that will cause the acceleration of the bulk electrons towards the substrate. As bulk electrons are accelerated across the strong transient electric field region, they can gain up to hundreds or thousands of electron-volts (eV) of energy and become highly directional towards the substrate, which is another source highly directional electrons that will go deep inside the feature formed on the substrate to neutralize positive residual charges formed therein. Thus, in some embodiments, the generated secondary electrons, which can gain energies up to 3 keV, are highly directional towards the substrate surface.

Figure 6B:
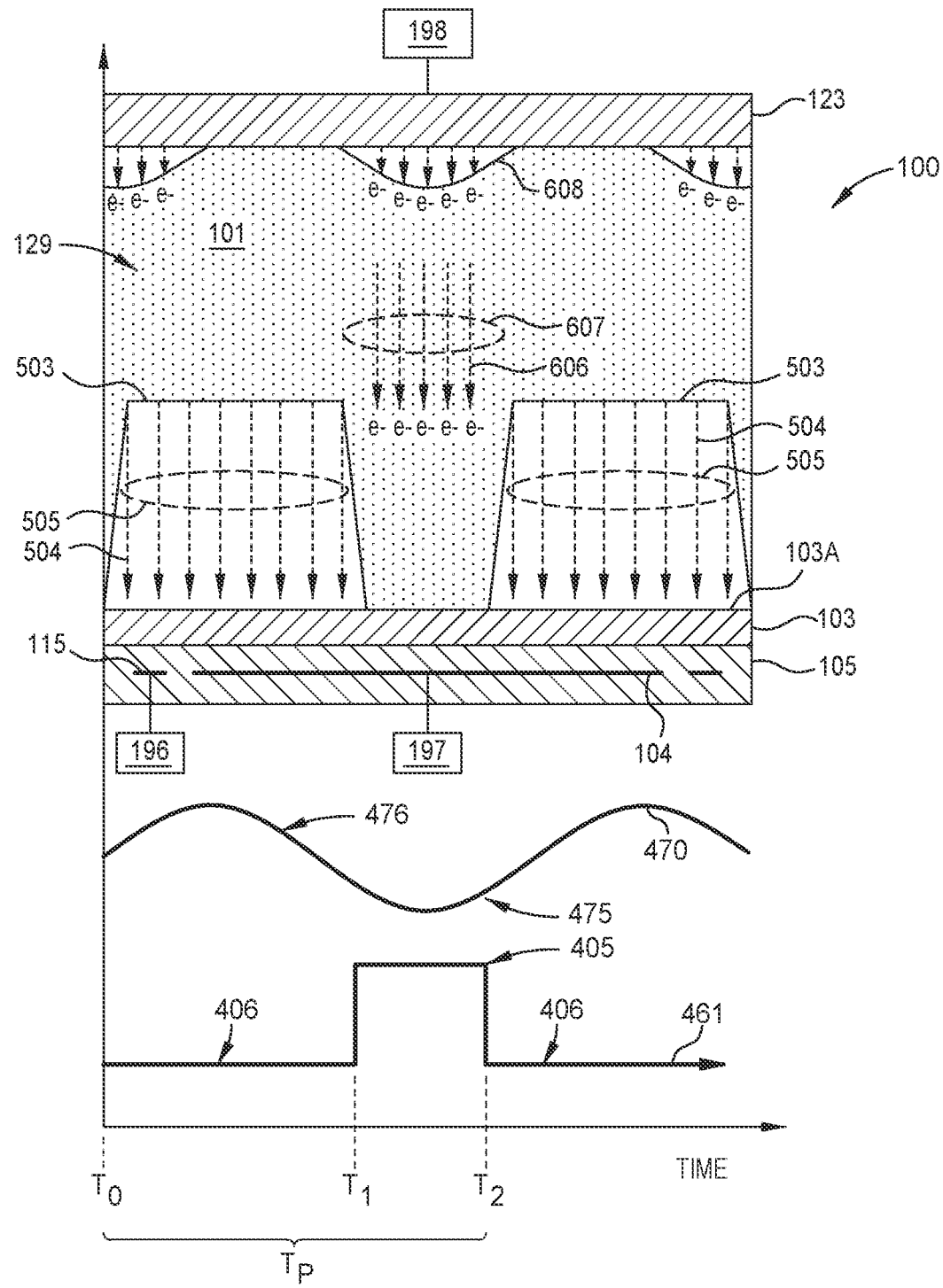
FIG. 6B is a simplified schematic of the processing chamber that includes an overlaid representation of RF and PV waveforms that are applied to electrodes within the process chamber, according to one or more embodiments provided herein.

FIG. 6B illustrates a simplified schematic of the processing chamber 100 that also includes an overlaid representation of a RF waveform cycle for the RF waveform 470 applied to the upper electrode (e.g., chamber lid 123) and the PV waveforms 461 applied to the bias electrode 104. As illustrated in FIG. 6B, during the second region 406 of the PV waveform 461 and second region 476 of the RF waveform 470 a sheath 503 is formed over the surface of the substrate 103 that accelerate ions 504 from bulk plasma to bombard the surface 103A of the surface of the substrate 103. As discussed above, the bias applied to the bias electrode 104 is controlled by the peak-to-peak voltage $V_{PP}$ applied by the PV waveform generator 150 and the RF generator assembly 163, which controls the sheath thickness and sets the ion energy used to bombard the surface 103A of the substrate 103.

During the first region 405 of the PV waveform 461 and first region 475 of the RF waveform 470 a sheath 608 is formed over the surface of the upper electrode (i.e., chamber lid 123) that allows ions being accelerated from bulk plasma through the sheath 608 to bombard the surface of the upper electrode, which generates secondary electrons 606 that are contained within an electron flux 607. The process of bombarding the surface of the upper electrode will last for a time period that extends between time $T_1$ and time $T_2$, as shown in FIG. 6B. Since the parallel geometry of upper electrode and the substrate, the secondary electrons are accelerated by the sheath 608 in the direction perpendicular to the substrate surface, so that they become highly directional towards the substrate and can go deep into the features formed on the surface of the substrate 103 to interact with and neutralize the trapped positive charge there during stage 405 of the PV waveform cycle. In some embodiments, the highly energetic electrons generated during stage 405 of the PV waveform cycle can also be utilized to improve the selectivity of etching material to mask material, and/or etching material to etching stop layer.

Embodiments of the disclosure may provide a processing method, that includes establishing, by use of a first waveform generator, a first pulse voltage waveform at a bias electrode disposed in a substrate support assembly, and establishing, by use of a second waveform generator, a second pulse voltage waveform at a surface of a first electrode disposed over the substrate support assembly. The first pulse voltage waveform includes a first stage, and a second stage that has a lower voltage level than a voltage level in the first stage. The second pulse voltage waveform includes a first stage, and a second stage that has a higher voltage level than a voltage level in the first stage. During the processing method the first pulse voltage waveform and the second pulse voltage waveform are synchronized, so that the first stage of the first pulse voltage waveform and the first stage of the second pulse voltage waveform at least partially overlap in time, and the second stage of the first pulse voltage waveform and the second stage of the second pulse voltage waveform at least partially overlap in time. The voltage level during the first stage of the second pulse voltage waveform can be configured to generate secondary electrons from the surface of the first electrode, wherein the first electrode comprises silicon. During the processing method a duration of time of the first stage of the first pulse voltage waveform and a duration of time of the first stage of the second pulse voltage waveform can be substantially equal. In some embodiments, the voltage level in the first stage of the second pulse voltage waveform is configured to cause ions to bombard a surface of the first electrode, and generate secondary electrons which can gain energies up to 3 keV to become highly directional towards the substrate surface. The frequency of the first pulse voltage waveform and the second pulse voltage waveform may also be less than about 1 MHz.

The processing methods disclosed herein may further include establishing, by use of a third waveform generator, a third pulse voltage waveform at a second electrode disposed in the substrate support assembly, wherein the third pulse voltage waveform comprises a first stage, and a second stage that has a lower voltage level than a voltage level in the first stage. In some embodiments, the first stage of the first pulse voltage waveform and the first stage of the third pulse voltage waveform are simultaneously established, and the second stage of the first pulse voltage waveform and the second stage of the third pulse voltage waveform are simultaneously established.

Embodiments of the disclosure may provide a processing method, comprising establishing, by use of a first waveform generator, a first pulse voltage waveform at a bias electrode disposed in a substrate support assembly, and establishing, by use of a RF waveform generator, an RF waveform at a first electrode disposed over the substrate support assembly. The first pulse voltage waveform includes a first stage, and a second stage that has a lower voltage level than a voltage level in the first stage. The substrate support assembly includes a substrate supporting surface, the bias electrode, and a first dielectric layer disposed between the bias electrode and the substrate supporting surface. In some embodiments, the RF waveform comprises a sinusoidal waveform, and the first pulse voltage waveform and the RF waveform are synchronized, so that a trough of the RF waveform is formed during a period of time when the first stage of the first pulse voltage waveform is established at the bias electrode, and a peak of the RF waveform is formed during a period of time when the second stage of the first pulse voltage waveform is established at the bias electrode. The processing method may further include establishing, by use of a third waveform generator, a third pulse voltage waveform at a second electrode disposed in the substrate support assembly, wherein the third pulse voltage waveform comprises a first stage, and a second stage that has a lower voltage level than a voltage level in the first stage. The first stage of the first pulse voltage waveform and the first stage of the third pulse voltage waveform may be simultaneously established, and the second stage of the first pulse voltage waveform and the second stage of the third pulse voltage waveform may also be simultaneously established. The first pulse voltage waveform and the RF waveform can have a frequency that is less than about 1 MHz.

Therefore, the above-described embodiments may be used alone or in combination to provide fine control over the generation or highly directional electrons towards the substrate surface within a portion of a waveform applied to an upper electrode disposed in a processing region of a capacitively coupled plasma (CCP) chamber. Beneficially, the embodiments may be performed by use of a system controller without adjusting or modifying individual chamber components, thus providing a processing recipe parameter that can easily be adjusted during processing of one or more substrates.

While the foregoing is directed to embodiments of the present disclosure, other and further embodiments of the disclosure may be devised without departing from the basic scope thereof, and the scope thereof is determined by the claims that follow.

What is claimed is:

1. A processing method, comprising:
    establishing, by use of a first waveform generator, a first DC pulse voltage waveform at a bias electrode disposed in an electrostatic chuck of a substrate support assembly, wherein
        the first DC pulse voltage waveform having a pulse frequency, the first pulse voltage waveform comprises:
            a first stage; and
            a second stage that has a lower voltage level than a voltage level in the first stage,
        the electrostatic chuck having a body formed of a dielectric material, the body comprising:
            a substrate supporting surface; and
            the bias electrode disposed in the dielectric material of the body; and
    establishing, by use of a RF waveform generator, an RF waveform at a first electrode disposed over the substrate support assembly, wherein
        the RF waveform comprises a sinusoidal waveform having an RF frequency, and
        the first pulse voltage waveform and the RF waveform are synchronized wherein the RF frequency matches the pulse frequency, so that
            a trough of the RF waveform is formed during a period of time when the first stage of the first pulse voltage waveform is established at the bias electrode, and
            a peak of the RF waveform is formed during a period of time when the second stage of the first pulse voltage waveform is established at the bias electrode.

2. The processing method of claim 1, further comprising:
    establishing, by use of a second waveform generator, a second pulse voltage waveform at a second electrode disposed in the substrate support assembly, wherein
        the second pulse voltage waveform comprises:
            a first stage; and
            a second stage that has a lower voltage level than a voltage level in the first stage.

3. The processing method of claim 2, wherein
    the first stage of the first pulse voltage waveform and the first stage of the second pulse voltage waveform are simultaneously established, and
    the second stage of the first pulse voltage waveform and the second stage of the second pulse voltage waveform are simultaneously established.

4. The processing method of claim 1, wherein the first pulse voltage waveform and the RF waveform have a frequency that is less than about 1 MHz.

5. The processing method of claim 1, wherein the voltage level in the peak of the RF waveform is configured to generate secondary electrons from a surface of the first electrode, and the first electrode comprises silicon.

6. The processing method of claim 5, wherein the voltage level in the peak of the RF waveform is configured to cause ions to bombard a surface of the first electrode, and generate secondary electrons which can gain energies up to 3 keV to become highly directional towards the substrate surface.

* * * * *